(12) United States Patent
Kim (10) Patent No.: US 6,922,369 B2
(45) Date of Patent: Jul. 26, 2005

(54) SEMICONDUCTOR MEMORY DEVICE WITH SELF-REFRESH DEVICE FOR REDUCING POWER CONSUMPTION

(75) Inventor: Yong-Ki Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 73 days.

(21) Appl. No.: 10/625,172

(22) Filed: Jul. 22, 2003

(65) Prior Publication Data

US 2004/0125680 A1 Jul. 1, 2004

(30) Foreign Application Priority Data

Oct. 31, 2002 (KR) .................................. 10-2002-0066924

(51) Int. Cl.[7] .............................................. G11C 7/00
(52) U.S. Cl. ...................................... 365/222; 365/226
(58) Field of Search ................................. 365/222, 226, 365/227, 228, 229

(56) References Cited

U.S. PATENT DOCUMENTS

| 5,654,930 | A | | 8/1997 | Yoo et al. | |
|---|---|---|---|---|---|
| 5,831,921 | A | | 11/1998 | Tsukude | |
| 6,137,743 | A | * | 10/2000 | Kim | 365/222 |
| 6,411,157 | B1 | | 6/2002 | Hsu et al. | |
| 6,434,075 | B2 | | 8/2002 | Ooishi | |
| 6,515,928 | B2 | * | 2/2003 | Sato et al. | 365/222 |
| 6,563,746 | B2 | * | 5/2003 | Fujioka et al. | 365/226 |
| 6,618,314 | B1 | * | 9/2003 | Fiscus et al. | 365/222 |
| 6,711,082 | B1 | * | 3/2004 | Loffler | 365/222 |
| 6,711,093 | B1 | * | 3/2004 | Shore et al. | 365/222 |
| 6,741,515 | B2 | * | 5/2004 | Lazar et al. | 365/222 |
| 6,744,687 | B2 | * | 6/2004 | Koo et al. | 365/226 |
| 6,816,426 | B2 | * | 11/2004 | Lee | 365/222 |
| 2003/0056053 | A1 | | 3/2003 | Jeon | |
| 2003/0061536 | A1 | | 3/2003 | Nakai et al. | |

FOREIGN PATENT DOCUMENTS

| JP | 02-062784 | 3/1990 |
|---|---|---|
| JP | 08-297969 | 11/1996 |

* cited by examiner

*Primary Examiner*—Trong Phan
(74) *Attorney, Agent, or Firm*—Blakely Sokoloff Taylor & Zafman (57) ABSTRACT

The present invention provides a memory device for reducing power consumption during a self-refresh operation performed for protecting data loss. For this object, in the present intention, the memory device for performing a refresh operation in a self-refresh period instigated for every constant time interval after entering into a self-refresh mode includes a low-power controller outputting a enable signal for enabling the power supply means during the self-refresh period after being enabled in the self-refresh mode; and a power supply means receiving the enable signal for supplying a low and a high voltages used in an internal circuit by using an external supply voltage and a ground voltage, wherein the low voltage is lower than the ground voltage and the high voltage is higher than the external supply voltage.

6 Claims, 12 Drawing Sheets

SEMICONDUCTOR MEMORY DEVICE WITH SELF-REFRESH DEVICE FOR REDUCING POWER CONSUMPTION

FIELD OF THE INVENTION

The present invention relates to a dynamic random access memory device; and, more particularly, to a memory device for reducing a power of self-refresh operation.

DESCRIPTION OF RELATED ART

In general, semiconductor device can be classified into a dynamic random access memory (hereinafter, referred as DRAM) and a static random access memory (hereinafter, referred as SRAM). The SRAM consisting of, e.g., 4 transistors, that constitutes a latch, can keep stored data without any loss as long as power supply is not eliminated. However, the DRAM composed of basic cells, wherein each basic cell is made of one transistor and one capacitor keeps data in the capacitor. According to the characteristic of the capacitor, charge of the capacitor storing data is dissipated in proportion with a storage time. Therefore, the DRAM using such capacitor needs a periodic refresh operation.

A refresh operation includes the following cycle steps. First step is to change periodically row address and next step is to select a word-line. Then, the charge which is stored in a capacitor corresponding to the selected word-line and restored in the capacitor is amplified by a sense amplifier. Throughout the cycle refresh operation, data are kept stored without any loss.

In a prior art, a refresh operation is carried out in the manner that an essential instruction, an address, and others are inputted from an external circuit. However, in today, because of current achievements in convenient control, high-speed chip, and so on, the essential instruction, the address, and others are inputted from an internal part for the refresh execution.

There are two methods, namely an auto-refresh and a self-refresh, for the refresh operation operated by an address generated in the internal part.

In an auto-refresh memory device, a refresh address counter generates a low address and initiates the refresh operation after receiving a refresh address from an external circuit. Another name for this operation is the CAS-Before-RAS CBR refresh. In this manner, the refresh operation is carried out with use of the address generated from the internal part instead of using the address received from the external circuit when a /CAS signal occurs faster than a /RAS signal.

In a self-refresh memory device, the /RAS signal used as a refresh synchronization signal is generated in the internal part of the memory device. The self-refresh operation is initiated when the /CAS signal occurs faster than the /RAS signal and a few fixed conditions are satisfied.

Even though the self-refresh is the most effective method of reducing power consumption, power consumption during the self-refresh operation gradually increases as the memory device becomes highly integrated. Hence, various methods of reducing power consumption have been vigorously researched.

Figure 1:
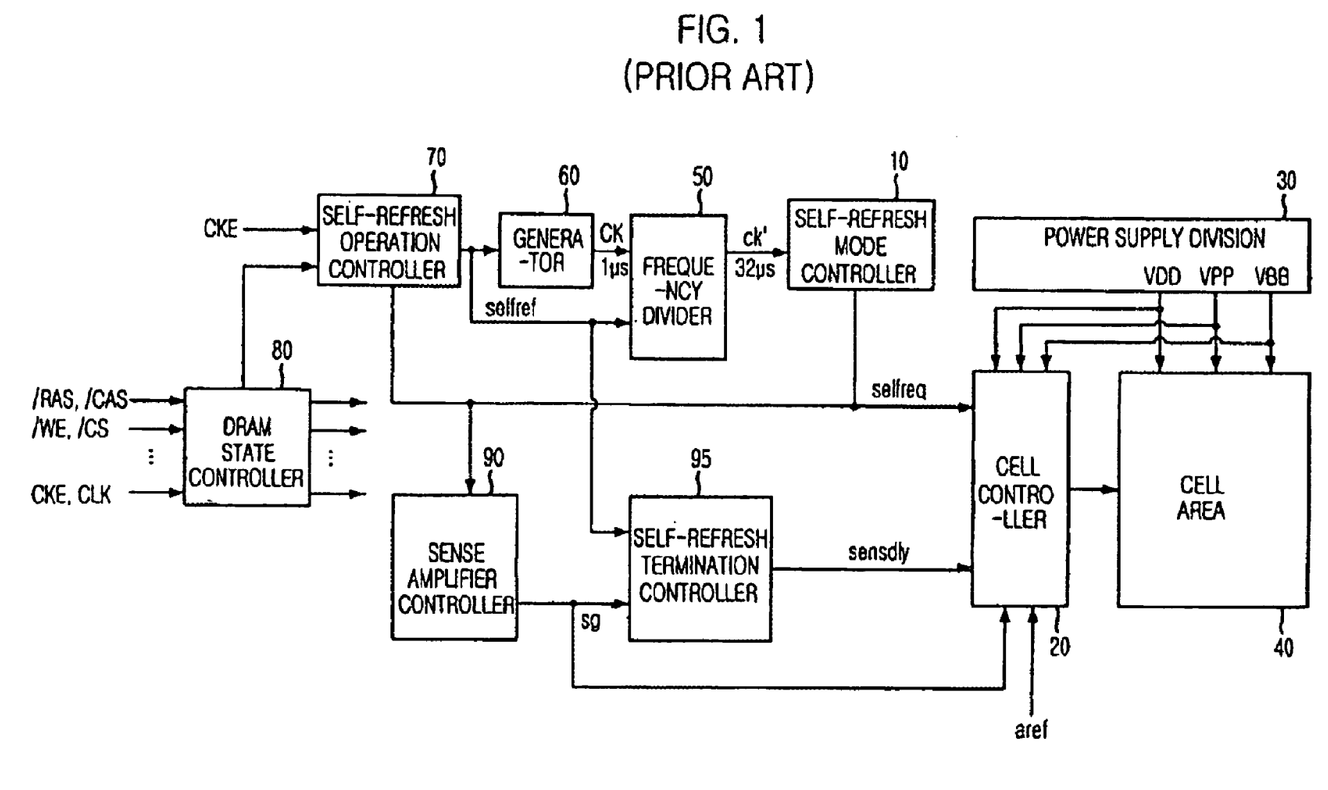
FIG. 1 is a block diagram showing a self-refresh operation in a conventional memory device.

FIG. 1 is a block diagram showing a self-refresh operation unit in a conventional memory device.

As shown, the self-refresh operation unit in the memory device includes a DRAM state controller 80, a self-refresh operation controller 70, a generator 60, a frequency divider 50, a self-refresh mode controller 10, a sense-amplifier controller 90, a self-refresh termination controller 95, a cell area 40, a cell controller 20, and a power supply division 30.

The DRAM state controller 80 controls a state of the memory device, i.e., storing, reading, and refreshing state, after receiving several control signals such as /RAS, /CAS, /WE, /CS, CKE, CLK, and the like from an external circuit (not shown). The self-refresh operation controller 70 outputs a self-refresh enable signal (hereinafter, referred as 'selfref' signal) after receiving a self-refresh entering signal (hereinafter, referred as 'selfcom' signal) outputted from the DRAM state controller 80. The generator 60 is enabled by the selfref signal and then outputs a clock signal ck of a reference frequency, i.e., 1 MHz. The frequency divider 50 outputs a divided clock signal ck'. The self-refresh mode controller 10 outputs a self-refresh operation signal (hereinafter, referred as 'selfreq' signal) which represents a timing for starting self-refresh operation by using the output of the frequency divider 50. The sense-amplifier controller 90 outputs a sense-amplifier enable signal (hereinafter, referred as 'SG' signal) after receiving the selfreq signal. The self-refresh termination controller 95 outputs a self-refresh termination signal sensdly for finishing the self-refresh operation at time that a sense-amp completes sensing, amplifying steps after receiving SG signal. The cell area 40 has a lot of unit cells. The cell controller 20 controls the refresh operation of the cell area 40 by the selfreq signal and the sensdly signal. The power supply division 30 supplies a power to the cell area 40 and cell controller 20.

Figure 2:
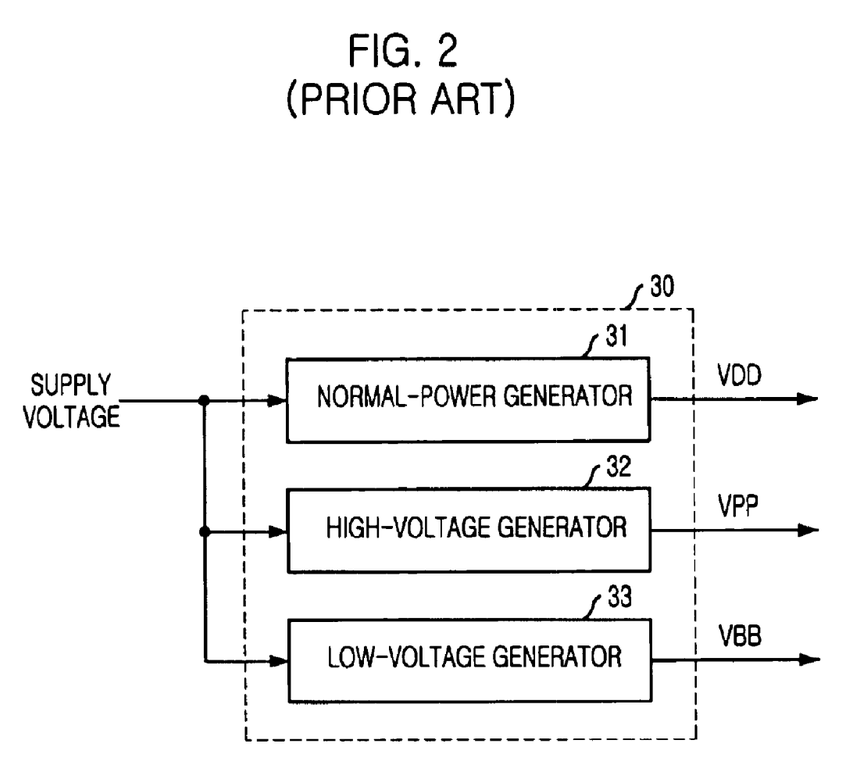
FIG. 2 is a block diagram of a power supply division shown in FIG. 1.

FIG. 2 is a block diagram of the power supply division shown in FIG. 1.

As shown, after the power supply division 30 includes a normal-power generator 31 for supplying a first voltage VDD to an internal circuit after receiving an exterior supply voltage, a high-voltage generator 32 for supplying a second voltage VPP to the internal circuit; and a low-voltage generator 33 for supplying a third voltage VBB to a cell area. The first voltage VDD is a power voltage typically supplied to an internal part of a memory device. The second voltage VPP is used in a case that the memory device needs either a high speed operation like a over-driving or a high voltage being higher than the first voltage VDD in respect of the circuit formation. For instance, the memory device can be designed in a manner that the second voltage VPP is about 3.3V if the first voltage VDD is about 2.5V. The third voltage VBB is and a lower voltage than a ground voltage for being supplied to a board region.

Figure 3:
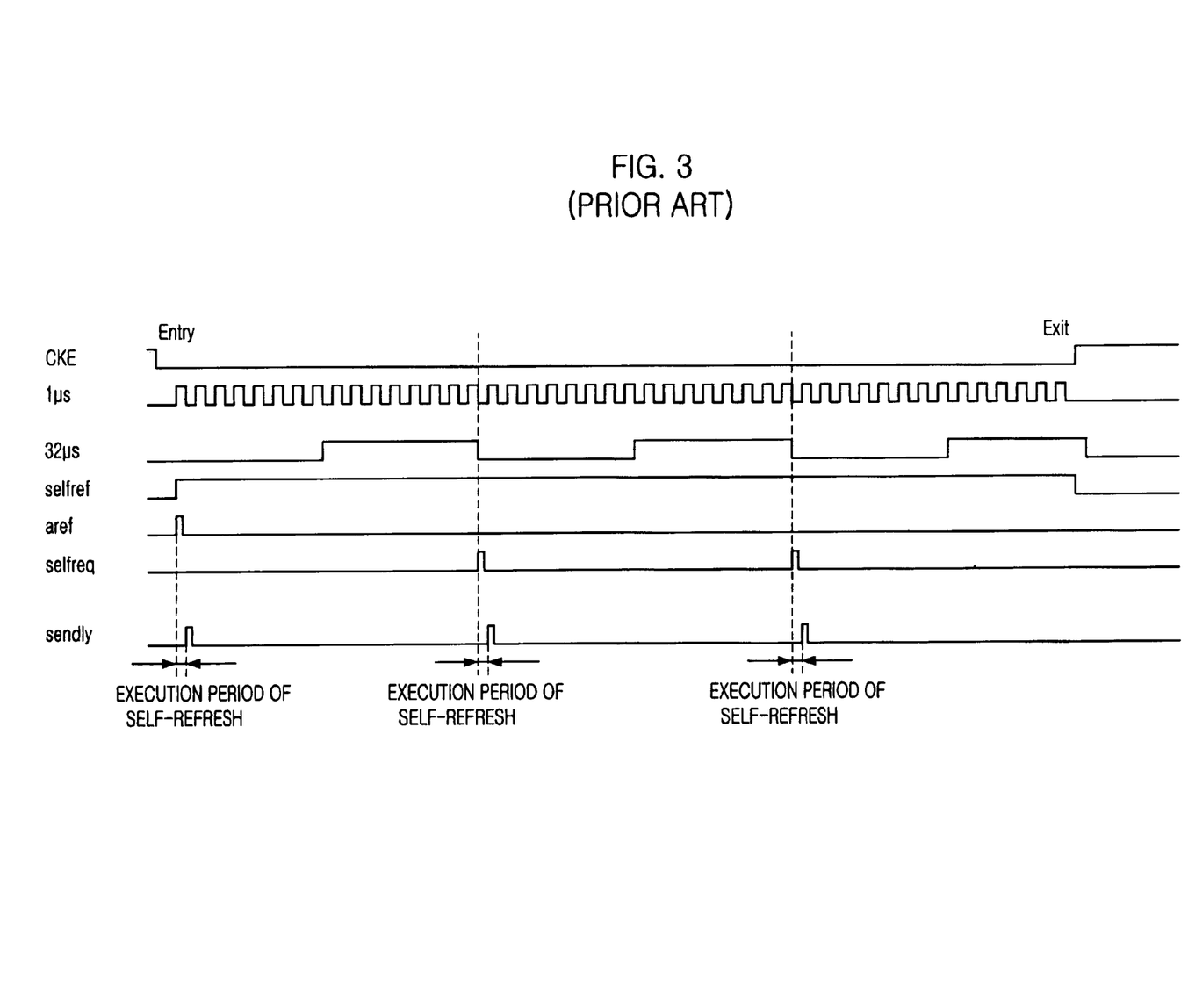
FIG. 3 is a timing diagram of the self-refresh operation of the memory device shown in FIG. 1.

FIG. 3 is a timing diagram of the self-refresh operation of the memory device shown in FIG. 1.

Hereinafter, referring to FIGS. 1 to 3, there is provided a detailed description about the self-refresh operation of the conventional memory device.

First, after the DRAM state controller 80 receives /RAS, /CAS, various control signals, e.g., /CS, /WE, CKE, CLK, and others from an external circuit, it outputs a selfcom signal to the self-refresh operation controller 70.

Then, the self-refresh operation controller 70 outputs a selfref signal during the self-refresh operation after receiving a clock enable signal (hereinafter, referred as CKE) and the selfcom signal. The CKE signal enables a clock buffer not shown inside the memory device. The clock outputted from the enabled clock buffer not only uses a criterion of the memory device operation but also adjusts a timing of data outputted to the external circuit. Herein, the CKE signal decides a period of the enabled selfref signal.

The generator 60 is enabled by the selfref signal, and then creates a clock signal (hereinafter, referred as 'ck' signal).

The frequency divider 50 outputs a clock divided from the ck signal by 32 times. Herein, the ck signal has a frequency of about 1 MHz and a period of about 1 us, and the 32 times divided clock supplies the timing for beginning the self-refresh operation during the self-refresh period.

Using the 32 times divided clock, the self-refresh mode controller 10 outputs the selfreq signal at every fixed time of the self-refresh period.

The cell controller 20 progresses the refresh operation of the cell area 40 after receiving the selfreq signal. Even though the cell controller 20 is described as one block for a convenient explanation, it is referred to types of all control block for storing and reading data in the cell area 40 by containing a column decoder, a row decoder and others.

The sense-amp controller 90 outputs the SG signal after receiving the selfreq signal. The SG signal operates the sense-amplifier during the self-refresh operation as well as a normal operation and, in normal operation, it is created by other received control signals even if not shown.

After receiving the SG signal, the self-refresh termination controller 95 outputs the sensdly signal delayed for a fixed time. The SG signal is used for enabling a sense-amplifier of the cell area 40. Herein, the fixed time should be a sufficient time for performing a series of operations that the sense-amplifier is enabled, data in a cell of requiring the refresh operation is supplied to a bit line and the sense-amplifier detects and amplifies the data of the bit line and, then, restores the data in the cell.

The cell controller 20 performs the refresh operation from receiving the selfreq signal to receiving the sendly signal. Even though an auto refresh signal (hereinafter, referred as 'aref' signal) is needed for auto-refresh operation, it can be used for operating a first self-refresh operation during the self-refresh period.

Thus, in respect of the memory device, in the period that the selfref signal is enabled, the self-refresh operation starts at a moment that the selfreq is generated and continues till a moment that the sensdly signal.

The memory device receives a power voltage from the external circuit, and then supplies a first or a second or a third voltage VDD, VPP or VBB to the cell area 40 and other internal circuits. The first voltage VDD generated from the normal-power generator 31 described in FIG. 2 uses a main power voltage of the internal circuit. The second voltage VPP generated from the high-voltage generator 32 is used in a part that needs a high-speed operation. For instance, it is used to be supplied to the word line or to turn on a switch that connects the sense-amplifier to the cell array. The third voltage VBB is used to a substrate power of all MOS transistors. Also, even though it is not shown, the power supply division 30 has a part for supplying a ground voltage.

The power consumption of the self-refresh operation in the memory device is increasing as an implementation of cells in the memory device is increasing. For example, it is predicted that the power consumption is about 500 $\mu$A as in a 64 M memory device, about 700 $\mu$A as in a 128 M memory device, about 1500 $\mu$A as in 256 M memory device, and about 2500 $\mu$A as in a 512 M memory device.

Thus, because the self-refresh operation has a lot of effects on the total power consumption of the memory device, there is needed a method of the self-refresh operation for reducing the power consumption.

SUMMARY OF THE INVENTION

It is, therefore, an object of the present invention to provide a memory device which can reduce a power consumption during self-refresh operation without a loss of data.

In accordance with an aspect of the present invention, there is provided the memory device for performing a refresh operation in a self-refresh period instigated for every constant time interval after entering into a self-refresh mode including a low-power controller outputting a enable signal for enabling the power supply means during the self-refresh period after being enabled in the self-refresh mode; and a power supply means receiving the enable signal for supplying a low and a high voltages used in an internal circuit by using an external supply voltage and a ground voltage, wherein the low voltage is lower than the ground voltage and the high voltage is higher than the external supply voltage.

In accordance with another aspect of the present invention, there is provided a method for operating the memory device, including the steps of: entering into a self-refresh mode; and operating a refresh operation in a self-refresh period instigated for every constant interval of the self-refresh mode, wherein the internal power is supplied during the self-refresh period of the self-refresh mode.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a memory device of the present invention will be described in detail referring to the accompanying drawings.

Figure 4:
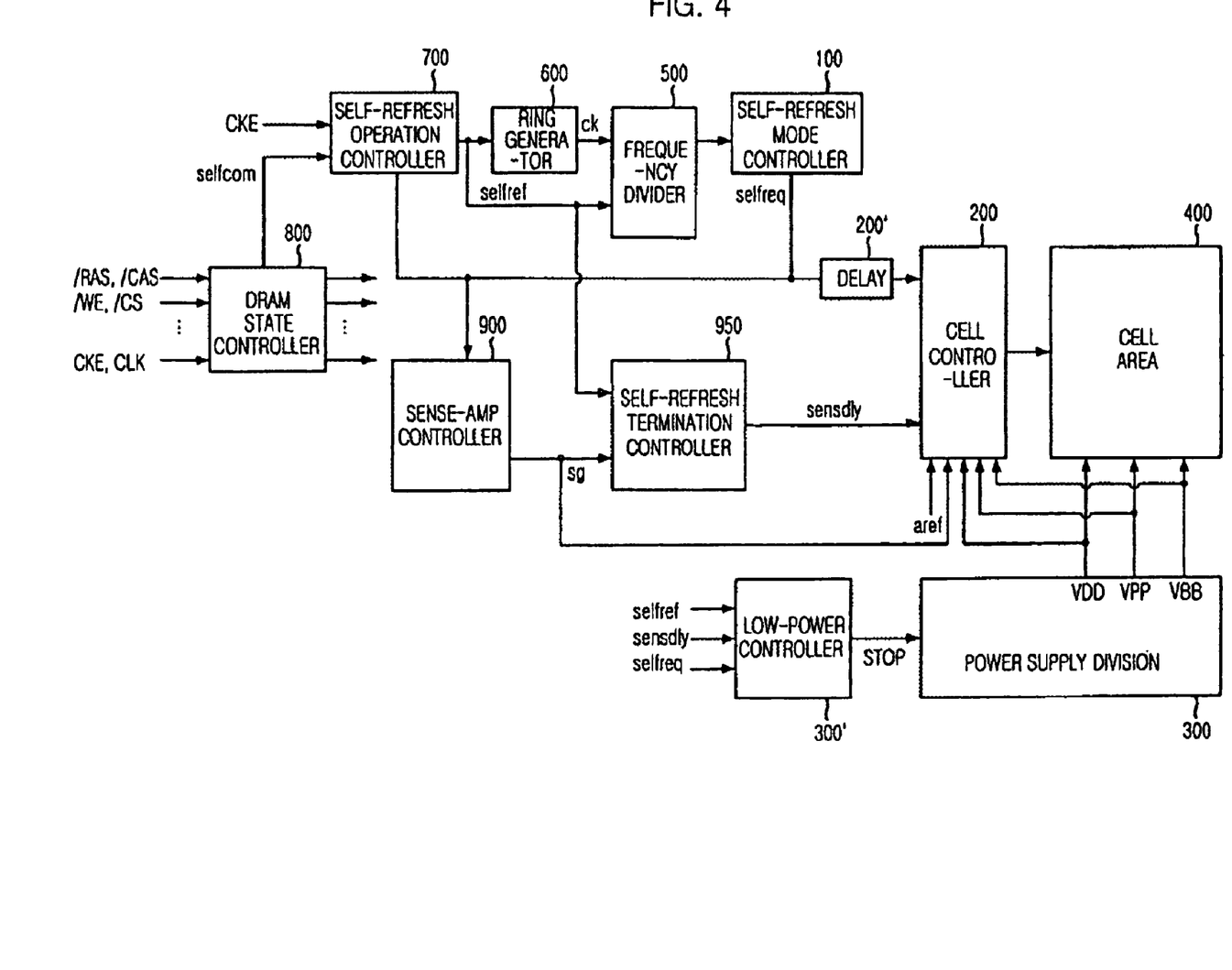
FIG. 4 is a block diagram for a self-refresh operation in a memory device in accordance with an preferred embodiment of the present invention.

FIG. 4 is a block diagram for a self-refresh operation in a memory device in accordance with a preferred embodiment of the present invention.

As shown, the memory device related to refresh operation includes a DRAM state controller 800, a self-refresh operation controller 700, a generator 600, a frequency divider 500, a self-refresh mode controller 100, a sense-amplifier controller 900, a self-refresh termination controller 950, a cell area 400, a cell controller 200, and a power supply division 300. The memory device further includes a low-power controller 300'. The DRAM state controller 800 controls a state of the memory device, e.g., storing, reading, refreshing, after receiving several control signals such as /RAS, /CAS, /WE, /CS, CKE, CLK, and so on from an external circuit. The self-refresh operation controller 700 outputs a self-refresh enable signal (hereinafter, referred as 'selfref' signal) after receiving a self-refresh entering signal herein, referred as 'selfcom' signal outputted by the DRAM state controller 800. The generator 600 is enabled by the selfref signal and then ouputs a clock signal (hereinafter, referred as 'ck' signal) of reference frequency, e.g., a frequency in about 1 MHz. The frequency divider 500 outputs a signal after divides the ck signal. The self-refresh mode controller 100 ouputs a self-refresh operation signal (hereinafter, referred as 'selfreq' signal) which represents a timing for starting the self-refresh operation using the ouput of the frequency divider 500. The sense-amplifier controller 900 outputs a sense-amplifier enable signal (hereinafter, referred as 'SG' signal) after receiving the selfreq signal. The self-refresh termination controller 950 outputs a self-refresh termination signal (hereinafter, referred as 'sensdly' signal) for finishing the self-refresh operation at time that a sense-amplifier completes sensing and amplifying the data in the bit line after receiving the SG signal. The cell area 400 has a plurality of cell units. The cell controller 200 controls the refresh operation of the cell area 400 by the selfreq signal and the sensdly signal. The power supply division 300 supplies a power to the cell area 400 and the cell controller 200.

Figure 5:
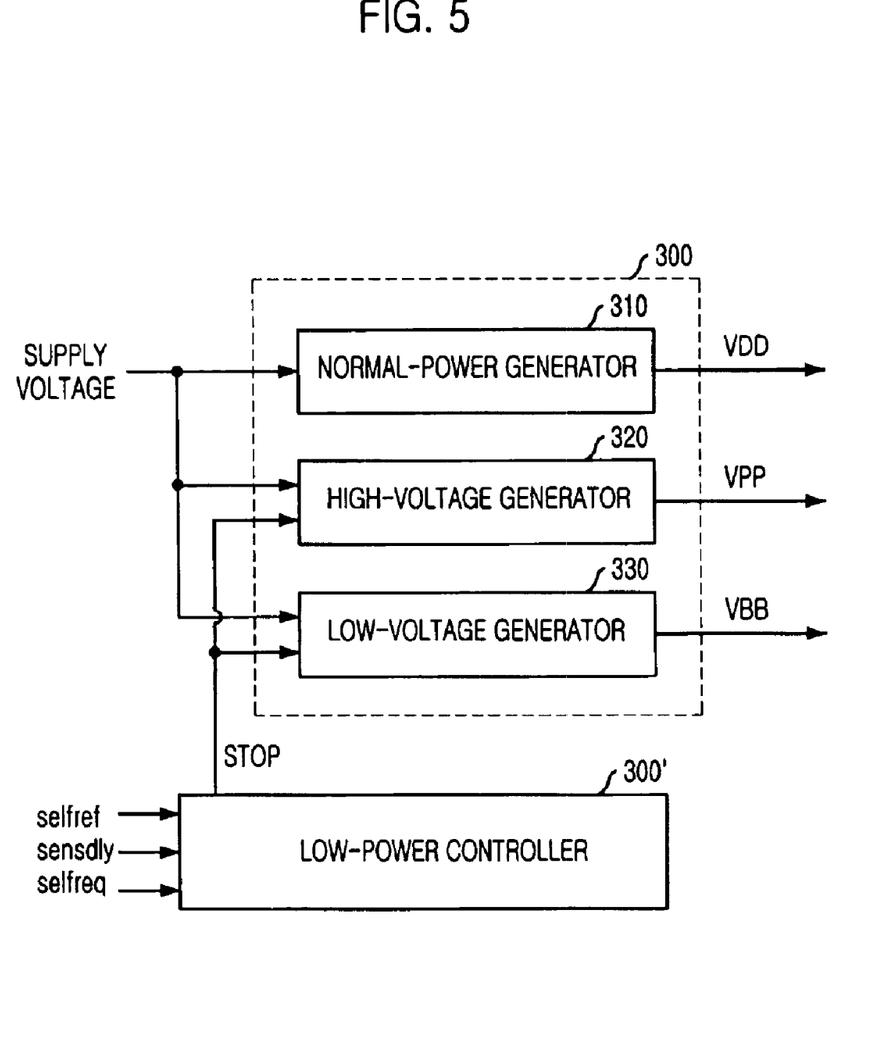
FIG. 5 is a block diagram of a power supply division shown in FIG. 4.

FIG. 5 is a block diagram of the power supply division shown in FIG. 4.

As shown in FIG. 5, after the power supply division 300 receives an exterior supply voltage, it includes a normal-power generator 310 for supplying a first voltage VDD to an internal circuit; a high-voltage generator 320 for supplying a second voltage VPP to an internal circuit; and a low-voltage generator 330 for supplying a third voltage VBB to the cell area.

The first voltage VDD is a power voltage typically supplied to an internal part of a memory device, and the second voltage VPP is used in a case that the memory device needs a high speed operation like over driving or a high voltage that is higher than the first voltage VDD in respect of circuit formation.

For instance, the memory device can be designed in a manner that the first voltage VDD is about 2.5V and the second voltage VPP is about 3.3V. The third voltage VBB is used as a voltage supplied to a substrate region of MOS transistors and is lower than a ground voltage.

Figure 6:
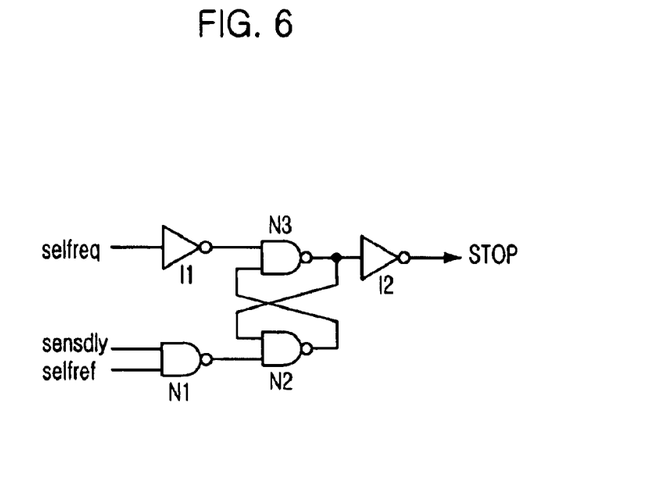
FIG. 6 is a circuit diagram of a low-power controller shown in FIG. 5.

FIG. 6 is a circuit diagram of the low-power controller 300' shown in FIG. 5.

As shown, the low power controller in the memory device includes a first NAND gate N1 receiving the selfref signal in the self-refresh operation and the sensdly signal enabled at a point of terminating the self-refresh operation; a second NAND gate N2 receiving an output signal of the first NAND gate and a output signal of a third NAND gate N3; and a third NAND gate N3 receiving a inverting signal of the selfreq signal enabling at a point of the self-refresh operation and a output signal of the second NAND gate.

Figure 7:
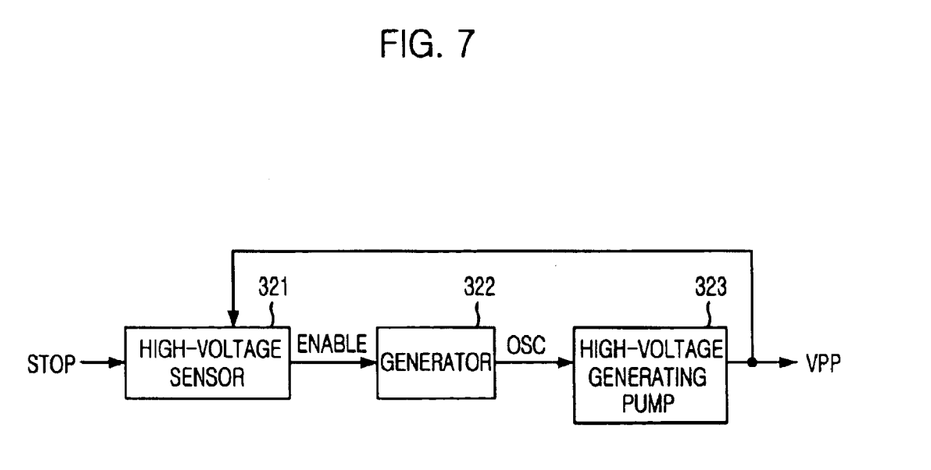
FIG. 7 is a circuit diagram of a high-voltage generator shown in FIG. 5.

FIG. 7 is a circuit diagram of the high-voltage generator shown in FIG. 5.

As shown, the high voltage generator in the memory device includes a high voltage sensor 321 for sensing the second power voltage level and being disabled in a self-refresh period; a generator 322 for making a clock signal by being controlled by a result sensed by the high voltage sensor 321; a high voltage generating pump 323 for making a high voltage, controlled by the clock signal.

Figure 8:
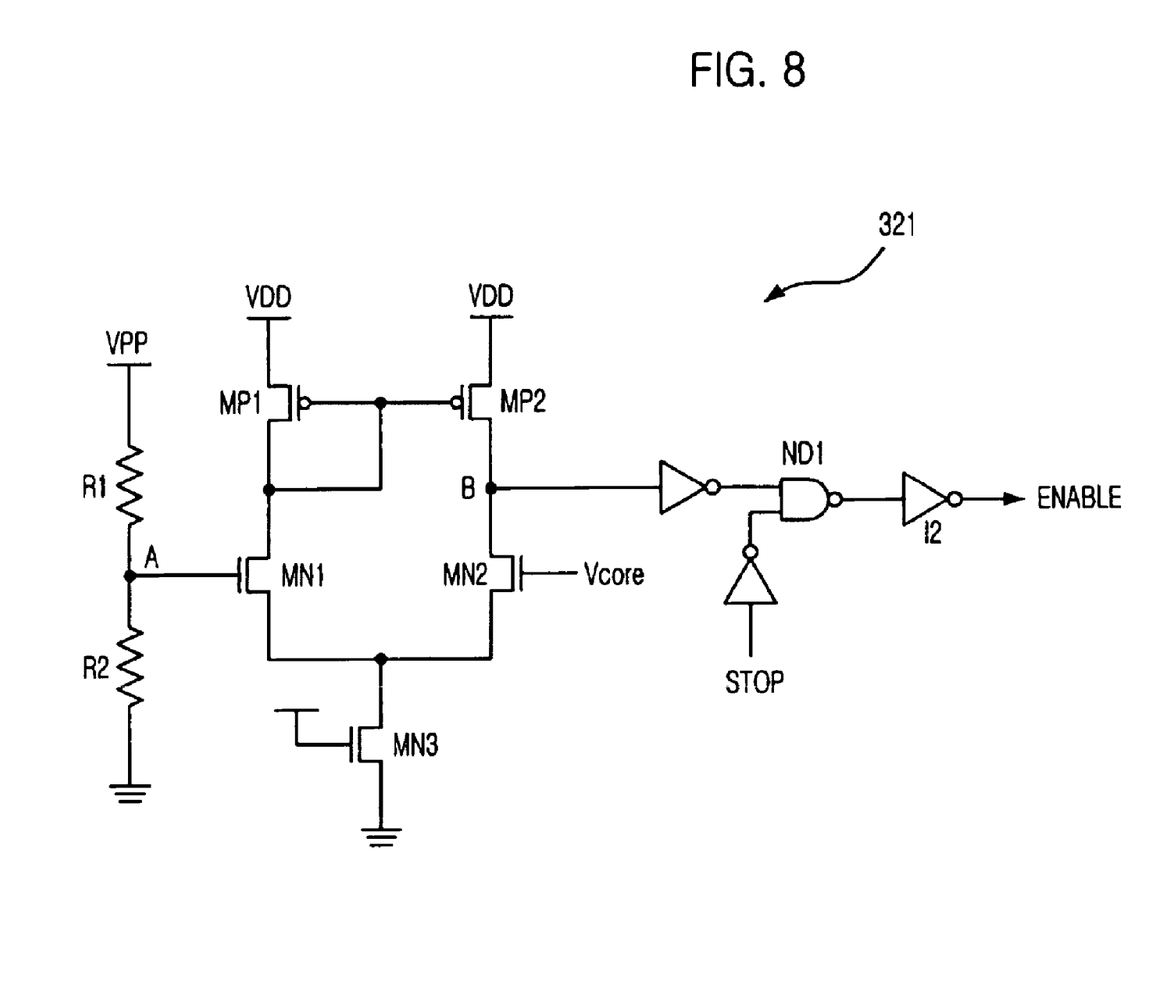
FIG. 8 is a circuit diagram of a high-voltage sensor shown in FIG. 7.

FIG. 8 is a circuit diagram of the high-voltage sensor shown in FIG. 7.

As shown, the high-voltage sensor 321 includes two resistors R1 and R2 serially connected between the supply voltage VDD and the ground voltage; a first PMOS transistor MP1 diode-connected by connecting its source to the supply voltage VDD; a second PMOS transistor MP2, its source being connected to the supply voltage VDD and its gate being connected to the gate of the PMOS transistor MP1 for forming a current mirror; a first NMOS transistor MN1, its drain being connected to the drain of the PMOS transistor MP1 and its gate being connected to a node A between two resistances R1 and R2; a second NMOS transistor MN2, its drain being connected to the drain of the PMOS transistor MP2 and its gate being connected to a voltage Vcore; a third NMOS transistor MN3, its drain being connected to sources of the first and second NMOS transistors MN1 and MN2 and its gate being connected to the supply voltage VDD and its source being connected to the ground; a inverter IN1 connected to a node B commonly connected to the second PMOS transistors MP2 and the second NMOS transistor MN2; a NAND gate ND1 receiving an output of the inverter IN1 and a signal inverted from a output of the low-power controller 300'; and an inverter IN2 outputting a generator enable signal after inverting an output of the NAND gate ND1.

Figure 9:
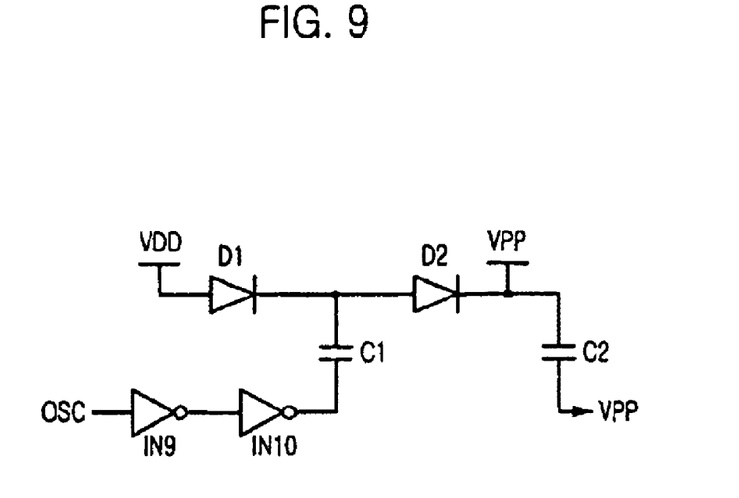
FIG. 9 is a circuit diagram of a high-voltage generating pump shown in FIG. 7.

FIG. 9 is a circuit diagram of the high-voltage generating pump shown in FIG. 7.

As shown, the high-voltage generating pump 323 indudes two inverters IN9 and IN10 buffering an output signal OSC of the generator 322; a first diode D1 connected to the supply voltage VDD; a first capacitor C1 connected between an output of the diode D1 and an output of the inverter IN10; a second diodes D2 connected to an output of the diode D1; and a second capacitor C2 connected to an output of the diode D2. Herein, a high-voltage VPP outputted from the capacitor flows through the high-voltage sensor 321 and the internal circuit.

Figure 10:
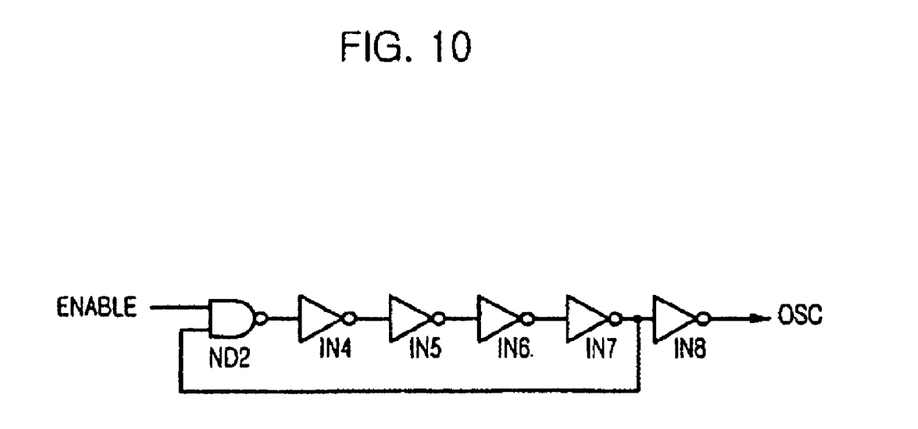
FIG. 10 is a circuit diagram of a generator shown in FIG. 7.

FIG. 10 is a circuit diagram of the generator shown in FIG. 7.

As shown, the generator 322 includes a two-input NAND gate ND2 receiving a generator enable signal ENABLE outputted from the high-voltage sensor 321, an inverter chain IN4 to IN7 outputting to the NAND gate ND2 after inverting an output of NAND gate ND2, and a inverter IN8 outputting the signal OSC to the high-voltage generating pump 323 after inverting a output of the inverter IN7.

Figure 11:
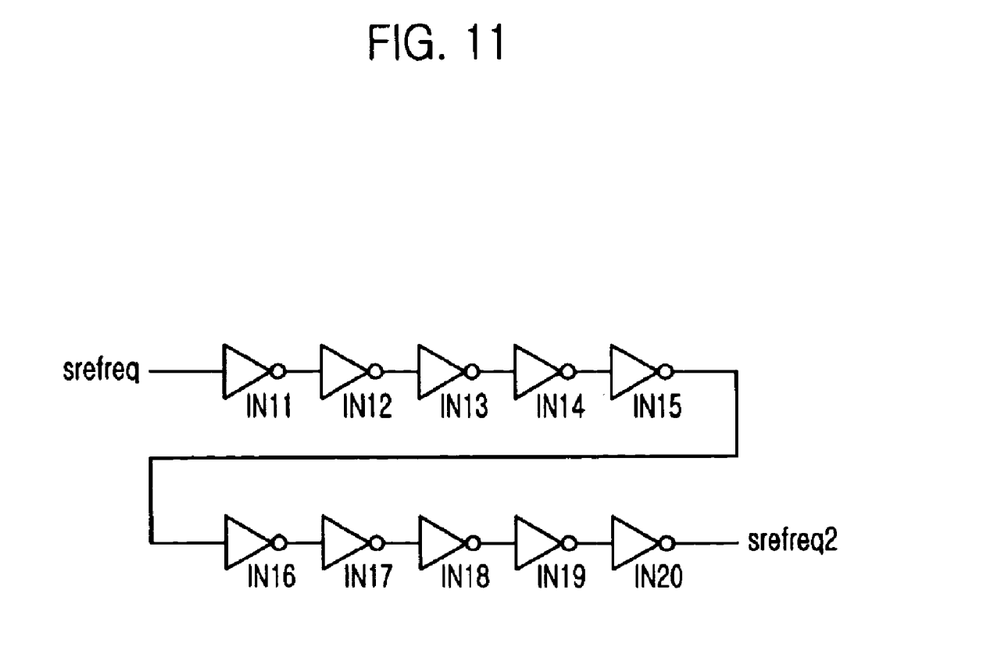
FIG. 11 is a circuit diagram of a delay block shown in FIG. 4.

FIG. 11 is a circuit diagram of a delay block shown in FIG. 4. Herein, the delay unit includes several serial-connected inverters, i.e., IN11 to IN20.

Figure 12:
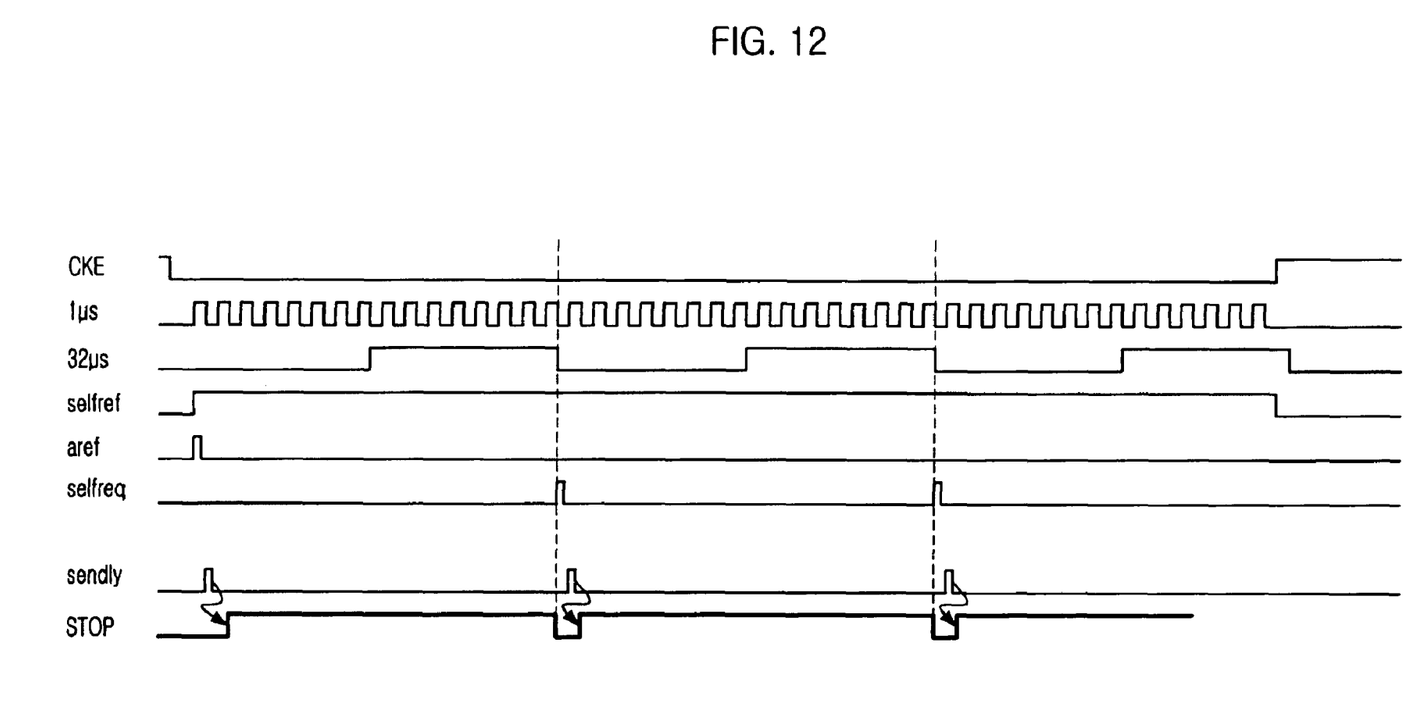
FIG. 12 is a timing diagram of the self-refresh operation of the memory device in accordance with the preferred embodiment of the present invention.

FIG. 12 is a timing diagram of the self-refresh operation of the memory device in accordance with the preferred embodiment of the present invention.

Hereinafter, referring to FIGS. 4 to 12, there is provided a description about the self-refresh operation of the memory device in accordance with the present invention.

First, after the DRAM state controller 800 receives /RAS, /CAS, various control signals such as /CS, /WE, CKE and CLK and others from the external circuit, it outputs the selfcom signal to the self-refresh operation controller 700.

The self-refresh operation controller 700 outputs the selfref signal during the self-refresh operation after receiving a cock enable signal (hereinafter, referred as 'CKE') and the selfcom signal. The CKE signal enables a clock buffer (not shown) in the memory device. The clock outputted from the enabled clock buffer not only uses a criterion of the memory device operation but also adjusts a timing of data outputted to the external circuit. Herein, the CKE signal decides a period for enabling the selfref signal.

The generator 600 is enabled by the selfref signal and, then generates the ck signal. The frequency divider 500 outputs a clock divided from the ck signal by 32 times. In the FIG. 12, the ck signal has a frequency of about 1 MHz period and a period of about 1 us, and the 32 times divided clock provides a timing for beginning the self-refresh operation during the self-refresh period.

Using the 32 times divided clock, the self-refresh mode controller 100 outputs the selfreq signal at every fixed time during the self-refresh period.

The cell controller 200 progresses the refresh operation of the cell area 400 after receiving the selfreq signal. Even though the cell controller 200 is described as one block for a convenient explanation, it is all control block for storing and reading data in the cell area 400. Herein, the cell controller 200 contains a column decoder, a row decoder, and others.

The sense-amplifier controller 900 outputs the SG signal after receiving the selfreq signal. The SG signal is used for enabling a sense-amplifier of the cell area 400. The SG signal operates the sense-amplifier during the self-refresh operation as well as normal operation and, in the normal operation, it is created by other received control signals even if not shown.

After receiving the SG signal, the self-refresh termination controller 950 outputs the sensdly signal delayed for a fixed time from that. Herein, the fixed time should be a sufficient period for performing a series of operations that the sense-amplifier is enabled; data in a cell of requiring refresh operation is supplied to a bit line; the sense-amplifier detects and amplifies the data; and the sense-amplifier restores the amplified data.

Consequently, the cell controller 200 progresses the refresh operation after receiving the selfreq signal and finishes the refresh operation after receiving the sensdly signal.

As shown in FIG. 12, the aref signal is needed for an auto-refresh operation. Even though it is not illustrated, the aref signal is generated from the DRAM controller 800 and outputted to the self-refresh operation controller. Herein, the aref signal is outputted to the cell controller 200 after the self-refresh operation is begun in response to operating signal of a first self-refresh operation.

In the next self-refresh operation, the refresh operation is operated in the cell controller 200 by an input of selfreq signal outputted from the self-refresh termination controller 950.

According to the present invention, the low-power controller 300' receives the selfref signal, the selfreq signal, and the sensdly signal and, then outputs a power-supply enable signal (hereinafter, referred as 'STOP' signal).

The STOP signal outputted from the low-power controller 300' is used for disabling the power supply division 300 at a timing of starting a self-refresh mode and enabling the power supply division 300 during the period of performing the refresh operation.

In the period that the selfref signal shown in FIG. 12 is enabled, namely self-refresh mode, the STOP signal is mostly high. However, the STOP signal is low in a period when the selfreq signal and the sensdly signal are generated, namely, a period when the self-refresh operation is performed.

Because the STOP signal outputted from the low-power controller is controlled by the selfreq signal for performing the self-refresh operation, there can be a problem that the cell controller 200 waits until receiving the power after receiving the selfreq signal during the self-refresh operation. To solve this problem, the delay 200' is further added for outputting the selfreq signal to the cell controller 200, after postponing the selfreq signal until the selfreq signal is generated and the STOP signal is generated later.

The high-voltage generator 320 and the low-voltage generator 330 of the power supply division 300 shown in FIG. 5 is enabled and supplies the second and the third voltage VPP and VBB in the period when the STOP signal is enabled, i.e., the STOP signal is low. For keeping the operation in balance, the normal-power generator 310 supplies the first and the second voltages constantly to the internal part regardless of the STOP signal.

Because the second and the third voltage VPP and VBB outputted from the high-voltage generator 320 and the low-voltage generator 330 are needed in the self-refresh operation, the present inventive device disables the high-voltage generator 320 and the low-voltage generator 330 at timing of starting the refresh operation and enables in period of the refresh operation, if the memory device performs the refresh operation. In this way, the power consumption can be largely reduced in the self-refresh operation mode.

The high voltage VPP generated from the high-voltage generator is used to enable the internal word line or to serve as a sign pole for connecting the sense-amplifier to the cell array.

Figure 13:
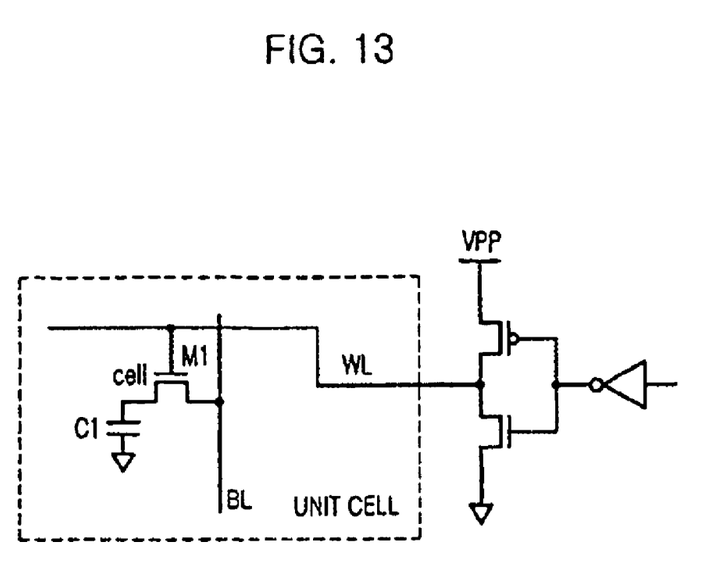
FIG. 13 and FIG. 14 are block diagrams for illustrating exemplary cases of using a high voltage outputted from the high-voltage generator described in FIG. 7.
Figure 14:
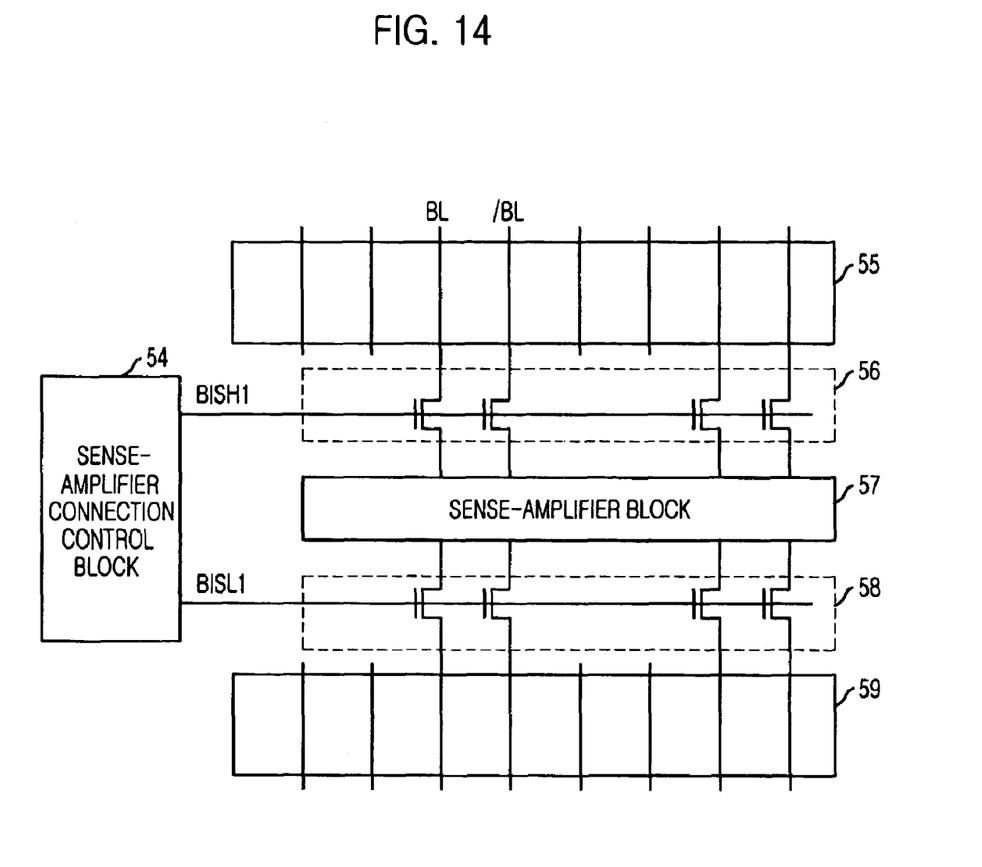

FIGS. 13 and 14 are block diagrams showing an preferred case of using the high voltage outputted from the high-voltage generator described in FIG. 7.

FIG. 13 shows a unit cell of the cell area. If a word line W/L is high, the high voltage is supplied to the word line W/L and a MOS transistor M1 is turned on. Subsequently, data stored in a capacitor C1 is supplied in a bit line B/L.

In other words, the refresh operation is carried out through the following steps: the power is supplied to the word line of the unit cell requiring the refresh operation; data of the unit cell supplies to the bit line; and the data is restored in the unit cell after being sensed and amplified by the sense-amplifier.

Thus, because there are several word lines in the memory device, the power consumption can be largely reduced if the high voltage VPP is supplied to several word lines in period when the refresh operation is performed.

In FIG. 14, there are described two cell arrays 55 and 59, a sense-amplifier division 57 for sensing and amplifying a voltage of the bit line connected to the cell arrays 55 and 59, switching transistors 56 and 58 for connecting or disconnecting the sense-amplifier division 57 to the cell array in response to a first bit isolation signal BISH1 and a second isolation signal BISL1, and a sense-amplifier connection control division for controlling the switching transistors 56 and 58.

For using effectively the cell area, the higher integrated memory device has the sense-amplifier between two cell arrays 56 and 58 so as to connecting or disconnecting the sense-amplifier division 57 to the cell array 55 and 58 by a preferred control. At this time, the high voltage VPP is used as a voltage that is supplied to the gates of the switching transistors 55 and 56 connected or disconnected to the sense-amplifier division 57. In above manner, the connection or disconnection between any one of the cell arrays 55 and 58 and the sense-amplifier division 57 is occurred faster.

According to the present invention, the power consumption during overall self-refresh operation can be largely reduced because the high voltage VPP is supplied in a period when the self-refresh operation is carried out, not in overall period of the refresh operation.

Besides the two exemplary cases, because the high voltage can be supplied in various manners during the self-refresh operation inside the memory device, the power consumption of the self-refresh operation can be reduced by controlling properly the high-voltage generator.

The typical DDR memory has a sufficient time for normalizing a power means because a relaxed time from termination of the present refresh operation to the beginning of the next refresh operation should be about 200 cycles. However, by using the above manner, the present invention can provide an enhanced effect when applied to highly integrated memory devices such as DDR memory.

Even though the preferred embodiment of the present invention describes the preferred control of the high voltage generator and the low voltage generator in the self-refresh mode, this method for supplying a basic power for maintaining data and once disabling the power supply means required in the refresh operation if the memory enters into the refresh mode and subsequently enabling it when the refresh operation is performed, can have wide application as one type of the memory device.

In the inventive memory device, the power consumption of the mandated self-refresh operation can be reduced. Because of this effect, a highly integrated memory device can be fabricated.

While the present invention has been described with respect to the particular embodiments, it will be apparent to those skilled in the art that various changes and modifications may be made without departing from the spirit and scope of the invention as defined in the following claims.

What is claimed is:

1. A memory device for performing at least one self-refresh operation during a self-refresh mode, comprising:
    a power supply means for generating a low and a high voltages, which are used in an internal circuit, according to an enable signal by using an external supply voltage and a ground voltage; and
    a low-power controller for generating the enable signal according to a performance of the self-refresh operation during the self-refresh mode, wherein the enable signal is activated when the self-refresh operation is performed and is inactivated when the self-refresh operation is not performed,
    wherein the low voltage is lower than the ground voltage and the high voltage is higher than the external supply voltage.

2. The memory device of claim 1, wherein the power supply means includes:
    a high power generator for receiving the external supply voltage to thereby supply the high voltage to the internal circuit according to the enable signal; and
    a low power generator for receiving the external supply voltage to thereby supply the low voltage to the internal circuit according to the enable signal.

3. The memory device of claim 2, wherein the power supply means further includes a normal-power generator for supplying an internal voltage to the internal circuit.

4. The memory device of claim 1, wherein the low power controller includes;
    a first NAND gate receiving a self-refresh enable signal activated during the self-refresh mode and a self-refresh termination signal activated when the self-refresh operation is terminated;
    a second NAND gate receiving an output signal of the first NAND gate; and
    a third NAND gate receiving an inverted signal of a self-refresh operating signal activated during the self-refresh operation and an output signal of the second NAND gate, wherein an output signal of the third NAND gate is inputted to the second NAND gate.

5. The memory device of claim 3, wherein the high voltage generator includes:
    a high voltage sensor for sensing the second power voltage level and being disabled when the self-refresh operation is performed;
    a generator for generating a clock signal according to a sensing result of the high voltage sensor; and
    a high voltage generating pump for generating the high voltage in response to the clock signal.

6. A method for operating the memory device, comprising the steps of:
    entering into a self-refresh mode; and
    performing at least one self-refresh operation during the self-refresh mode, wherein a high voltage and a low voltage are generated when the self-refresh operation is performed and are not generated when the self-refresh operation is not performed,
    wherein the high voltage is higher than an external power supply voltage and the lower voltage is lower than a ground voltage.

* * * * *